(12) United States Patent   (10) Patent No.: US 6,577,543 B2
Naritake                    (45) Date of Patent: Jun. 10, 2003

(54) SEMICONDUCTOR INTEGRATED CIRCUIT INCLUDING A PLURALITY OF MACROS THAT CAN BE OPERATED ALTHOUGH THEIR OPERATIONAL VOLTAGES ARE DIFFERENT FROM EACH OTHER

(75) Inventor: Isao Naritake, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/902,842

(22) Filed: Jul. 11, 2001

(65) Prior Publication Data

US 2002/0008555 A1 Jan. 24, 2002

(30) Foreign Application Priority Data

Jul. 24, 2000  (JP) .................................. 2000-221782

(51) Int. Cl.⁷ ................................................. G11C 7/00
(52) U.S. Cl. ................................. 365/189.08; 365/226
(58) Field of Search ................................. 365/191, 226, 365/201, 189.08, 189.02

(56) References Cited

U.S. PATENT DOCUMENTS 5,999,457 A * 12/1999 Sato ........................ 365/189.01
2002/0003725 A1 * 1/2002 Wada .......................... 365/200

FOREIGN PATENT DOCUMENTS

JP          10-247397        4/1998

* cited by examiner

*Primary Examiner*—David Nelms
*Assistant Examiner*—Thong Le
(74) *Attorney, Agent, or Firm*—Katten Muchin Zavis Rosenman

(57) ABSTRACT

A semiconductor integrated circuit, includes a first macro and a second macro. The first macro outputs a data signal. The second macro inputs the data signal. The first macro fixes the data signal at a non-high level state that is not a high level in response to a control signal.

6 Claims, 7 Drawing Sheets

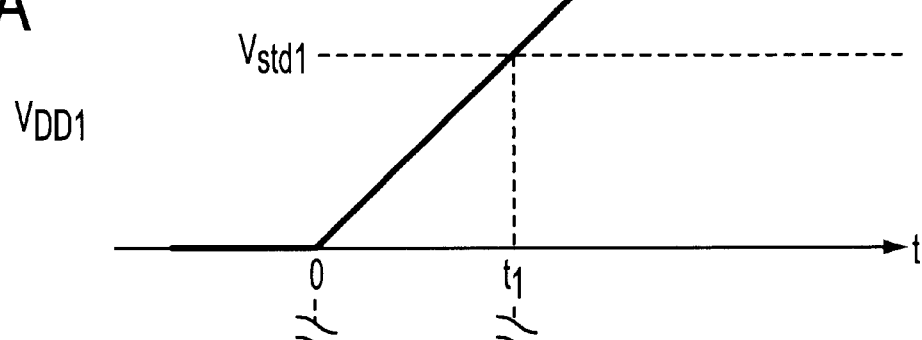
FIG. 4A  $V_{DD1}$
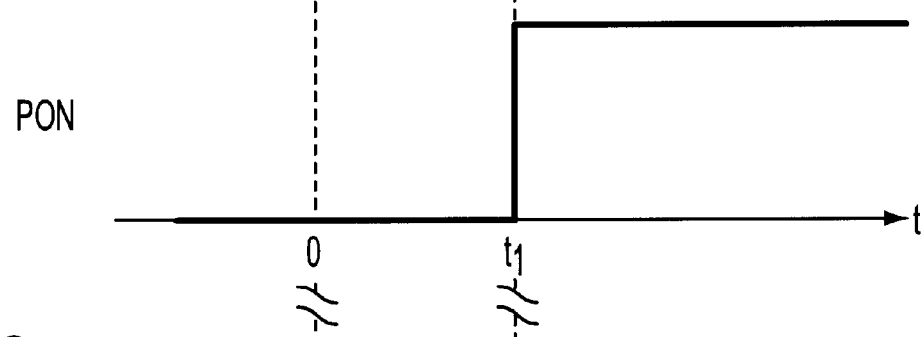
FIG. 4B  PON
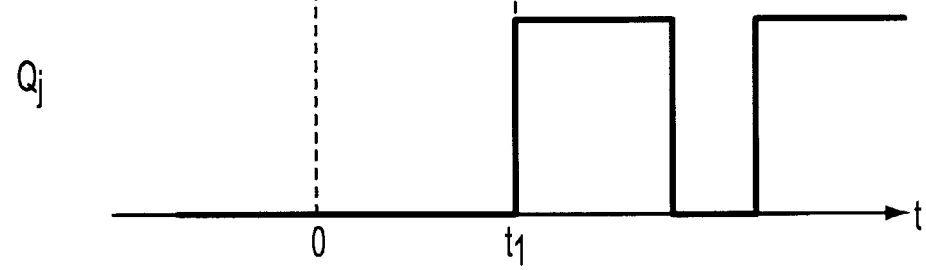
FIG. 4C  $Q_j$

SEMICONDUCTOR INTEGRATED CIRCUIT INCLUDING A PLURALITY OF MACROS THAT CAN BE OPERATED ALTHOUGH THEIR OPERATIONAL VOLTAGES ARE DIFFERENT FROM EACH OTHER

BACKGROUND OF THE INVENTION

1. Field of the Invention

The present invention relates to a semiconductor integrated circuit. More particularly, the present invention relates to a semiconductor integrated circuit including a plurality of macros that can be operated although their operational voltages are different from each other.

2. Description of the Related Art

In order to make a data transmission speed between a DRAM (Dynamic Random Access Memory) and a logic circuit faster, a logic in memory is used in which the DRAM and the logic circuit are integrated on the same semiconductor chip.

There may be a case that a burn-in is performed on this logic in memory, in order to improve the reliability, similarly to other semiconductor integrated circuits. When the burn-in is performed on the logic in memory, a power supply voltage higher than a sent power supply voltage in a normal operation is sent to the logic in memory, and the operation is carried out in atmosphere at a high temperature. Thus, the deterioration at a defective portion is accelerated to thereby bring about a potential defect in a short time.

When the burn-in is performed on the logic in memory, the DRAM and the logic circuit need to receive the power supply voltages different from each other. This is because the DRAM and the logic circuit have the structures of the semiconductor elements included in them and the manufacturing processes that are different from each other. For example, the thicknesses of gate oxide films of MOS (Metal Oxide Semiconductor) transistors included in the DRAM and the logic circuit are typically different from each other. Thus, it is necessary to perform the burn-in while sending the different power supply voltages to the DRAM and the logic circuit, in order to obtain the fault lives at the same level between the DRAM and the logic circuit. At this time, a power supply voltage higher than that of the logic circuit is typically sent to the DRAM.

At this time, if the DRAM to which the high power supply voltage is sent outputs a signal to the logic circuit to which the low power supply voltage is sent, there may be the fear of a break of a semiconductor element included in the logic circuit. For example, let us consider the DRAM mixture semiconductor integrated circuit, in which a DRAM having a gate oxide film having a film thickness of 9 nm and a logic circuit having a gate oxide film having a film thickness of 6 nm are mixed. It is necessary to send a power supply voltage of 4.5 V to the DRAM at the operation of the burn-in. On the other hand, a power supply voltage of 3.5 V is sent to the logic circuit at the operation of the burn-in. The DRAM to which the power supply voltage of 4.5 V is sent outputs a signal having an amplitude of 4.5 V to the logic circuit. However, the maximum rated voltage of the logic circuit having the gate oxide film having the film thickness of 6 nm is 4.0 V. Thus, there may be the fear the break of this logic circuit when the signal having the amplitude of 4.5 V outputted by the DRAM is inputted.

It is necessary to protect the logic circuit from being damaged, when the DRAM to which the high power supply voltage is sent outputs the signal having the same amplitude as the high power supply voltage, to the logic circuit to which the low power supply voltage is sent, at the operation of the burn-in.

The above-mentioned situation similarly occurs in a semiconductor integrated circuit in which two macros to which different power supply voltages are sent are placed on a single chip. When the semiconductor integrated circuit containing the two macros having the different operational voltages is operated, it is desirable to protect the break of the semiconductor element included in the macro having the lower operational voltage, by sending a signal having a high voltage from the macro having the higher operational voltage to the macro having the lower operational voltage.

By the way, the related technique is disclosed in Japanese Laid Open Patent Application (JP-A-Heisei, 10-247397). FIG. 1 shows the configuration of the known semiconductor integrated circuit disclosed thereby. A known semiconductor integrated circuit 101 is provided with a memory mat 102, a low decoder 103, a low driver 104, a column decoder 105, a column driver 106, a sense amplifier 107, a low address buffer 108, a column address buffer 109, a data input buffer 110, a data output buffer 111, an input output control circuit 112, an oscillator 113, a booster power supply circuit 114, a level sensor 115 and a control circuit 116.

The known semiconductor integrated circuit 101 stops sending a booster power supply voltage $V_{pp}$ from the booster power supply circuit 114 when a burn-in test is carried out, and thereby protects the normal circuit elements included in the low decoder 103 and the like from being damaged. If the burn-in test is not done, the booster power supply voltage $V_{pp}$ is sent from the booster power supply circuit 114 to the low decoder 103. On the other hand, if the burn-in test is done, a power supply voltage is sent to the low decoder 103 from an external portion of the semiconductor integrated circuit 101, and the booster power supply voltage $V_{pp}$ is not sent from the booster power supply circuit 114. Thus, it is possible to protect the break of the normal circuit elements, when an excessively high voltage is sent to the low decoder 103.

In the logic in memory in which the logic circuit and the DRAM that can be operated although their operational voltages are different from each other are mixed, there may be further a case of an occurrence of an erroneous operation, depending on a timing when the power supply voltages are sent to the DRAM and the logic circuit, respectively, when the power supply is turned on.

This is because the operation of the DRAM is unstable until the power supply voltage sent to the DRAM reaches a certain degree of a voltage, after the power supply is turned on. Thus, this unstable operation may cause a data inputted to the logic circuit from the DRAM to be a data in which an input to the logic circuit is not assumed. The input of such a data to the logic circuit may result in the occurrence of the erroneous operation in the logic circuit.

Moreover, although the power supply voltage sent to the logic circuit does not reach a certain degree of a voltage, if the DRAM starts its operation and outputs a signal to the logic circuit, an improper voltage may be applied to the semiconductor element included in the logic circuit, and a latch-up state may be induced.

It is desirable to protect such an erroneous operation from being brought about when the power supply is turned on.

SUMMARY OF THE INVENTION

The present invention is accomplished in view of the above mentioned problems. Therefore, an object of the present invention is to protect the break of the semiconductor element included in the macro having the lower operational voltage, by outputting a signal from the macro having the higher operational voltage to the macro having the lower operational voltage, when the semiconductor integrated circuit containing the two macros having the different operational voltages is operated.

Another object of the present invention is to protect the break of the semiconductor element included in the macro having the lower operational voltage, by outputting a signal to the macro on which the burn-in is performed while the lower power supply voltage is sent, from the macro on which the burn-in is performed while the higher power supply voltage is sent, in the semiconductor integrated circuit including the two macros on which the burn-in is performed while the different power supply voltages are sent.

Still another object of the present invention is to protect the break of the semiconductor element included in the logic macro, by outputting a signal to the logic macro on which the burn-in is performed while the lower power supply voltage is sent, from the DRAM macro on which the burn-in is performed while the higher power supply voltage is sent, in the DRAM mixture semiconductor integrated circuit in which the DRAM macro and the logic macro are mixed.

Still another object of the present invention is to protect the erroneous operation of the semiconductor integrated circuit when a power supply to the semiconductor integrated circuit including the two macros is started.

In order to achieve an aspect of the present invention, a semiconductor integrated circuit, includes: a first macro outputting a data signal; and a second macro inputting the data signal, and wherein the first macro fixes the data signal at a non-high level state that is not a high level in response to a control signal.

In this case, the non-high level state is a low level.

Also in this case, when a burn-in is performed on the semiconductor integrated circuit, the control signal indicates that the data signal is fixed at the non-high level state.

Further in this case, when a first power supply voltage supplied to the first macro is higher than a maximum rated voltage of the second macro, the control signal indicates that the data signal is fixed at the non-high level state.

In this case, the semiconductor integrated circuit, further includes: a first POR (Power On Reset) circuit monitoring a first power supply voltage supplied to the first macro and generating the control signal in response to the first power supply voltage, and wherein when the first power supply voltage is lower than a predetermined standard first voltage, the first POR circuit generates the control signal indicating that the data signal is fixed at the non-high level state.

Also in this case, the semiconductor integrated circuit, further includes: a second POR (Power On Reset) circuit monitoring a second power supply voltage supplied to the second macro and generating the control signal in response to the second power supply voltage, and wherein when the second power supply voltage is lower than a predetermined second standard voltage, the second POR circuit generates the control signal indicating that the data signal is fixed at the non-high level state.

Further in this case, the semiconductor integrated circuit, further includes: a third POR (Power On Reset) circuit monitoring a first power supply voltage supplied to the first macro and a second power supply voltage supplied to the second macro and generating the control signal in response to the first and second power supply voltages, and wherein when the first power supply voltage is lower than a predetermined first standard voltage, or the second power supply voltage is lower than a predetermined second standard voltage, the third POR circuit generates the control signal indicating that the data signal is fixed at the non-high level state.

In order to achieve another aspect of the present invention, a semiconductor integrated circuit, includes: a first macro having an output buffer outputting a data signal; and a second macro inputting the data signal, wherein a second power supply voltage is supplied to the second macro, and wherein the second power supply voltage is supplied to the output buffer, and wherein the output buffer outputs the data signal such that an amplitude of the data signal is substantially equal to that of the second power supply voltage.

In this case, a first power supply voltage higher than the second power supply voltage is supplied to a portion other than the output buffer of the first macro.

In order to achieve still another aspect of the present invention, a semiconductor integrated circuit, includes: a first macro outputting a data signal; and a second macro inputting the data signal, and wherein the second macro includes: an input buffer inputting the data signal; a logic circuit inputting an input data signal, wherein the input buffer outputs the input data signal in correspondence with the data signal, and wherein the input buffer includes a first MOS transistor, and wherein the logic circuit includes a second MOS transistor, and wherein a first gate oxide film included in the first MOS transistor is thicker than a second gate oxide film included in the second MOS film.

In this case, a first power supply voltage supplied to the first macro is higher than a second power supply voltage supplied to the second macro.

Also in this case, the first macro includes a third MOS transistor having a third gate oxide film, and wherein the second gate oxide film has a thickness substantially equal to that of the third gate oxide film.

In order to achieve still another aspect of the present invention, a semiconductor integrated circuit, includes: a first macro outputting an output data signal; a level shifter adjusting an amplitude of the output data signal in response to a control signal indicating whether or not a burn-in is performed on the semiconductor integrated circuit to generate an input data signal; and a second macro inputting the input data signal.

In this case, when the burn-in is performed on the semiconductor integrated circuit, the level shifter generates the input data signal such that amplitude of the input data signal is substantially equal to that of a second power supply voltage supplied to the second macro.

Also in this case, wherein a first power supply voltage supplied to the first macro is higher than a second power supply voltage supplied to the second macro.

In order to achieve yet still another aspect of the present invention, an operating method of a semiconductor integrated circuit, includes: (a) inputting a control signal indicating whether or not a burn-in is performed on a semiconductor integrated circuit; and (b) outputting a data signal, and wherein the (b) includes (c) fixing the data signal at non-high level state that is not a high level in response to the control signal when the burn-in is performed on the semiconductor integrated circuit.

In order to achieve another aspect of the present invention, an operating method of a semiconductor integrated circuit, includes: (d) supplying a first power supply voltage to a first macro; and (e) outputting a data signal from the first macro to a second macro, and wherein the (e) includes (f) fixing the data signal at a non-high level state that is not a high level when the first power supply voltage is higher than a maximum rated voltage of the second macro.

In order to achieve still another aspect of the present invention, an operating method of a semiconductor integrated circuit, includes: (g) supplying a power supply voltage; and (h) outputting a data signal, and wherein the (h) includes (i) fixing the data signal at a non-high level than is not a high level when the power supply voltage is lower than a predetermined standard voltage.

In order to achieve yet still another aspect of the present invention, an operating method of a semiconductor integrated circuit, includes: (j) supplying a first power supply voltage to a portion other than an output buffer of a first macro including the output buffer; (k) supplying a second power supply voltage to a second macro and the output buffer; and (l) outputting a data signal of which an amplitude is substantially equal to that of the second power supply voltage from the output buffer to the second macro.

In order to achieve another aspect of the present invention, an operating method of a semiconductor integrated circuit, includes: (m) outputting an output data signal; (n) inputting a control signal indicating whether or not a burn-in is performed on a semiconductor integrated circuit; and (o) adjusting an amplitude of the output data signal in response to the control signal to generate an input data signal.

BRIEF DESCRIPTION OF THE DRAWINGS

FIG. 4A is a view showing a part of an operation of the semiconductor integrated circuit in the second embodiment;

FIG. 4B is a view showing another part of an operation of the semiconductor integrated circuit in the second embodiment;

FIG. 4C is a view showing still another part of an operation of the semiconductor integrated circuit in the second embodiment;

DESCRIPTION OF THE PREFERRED EMBODIMENTS

Semiconductor integrated circuits in embodiments of the present invention will be described below with reference to the attached drawings.

(First Embodiment)

Figure 1:
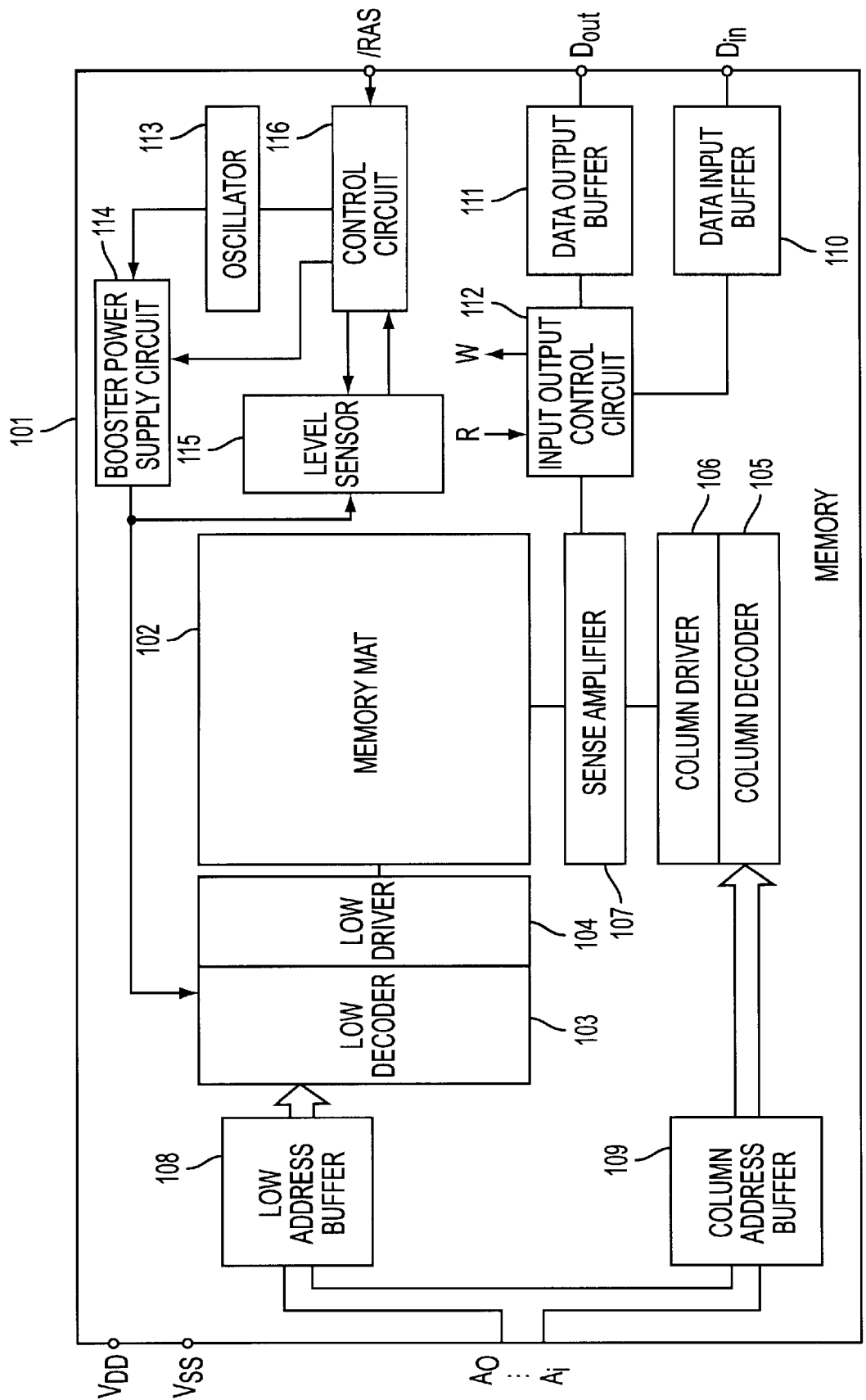
FIG. 1 is a view showing a configuration of a known semiconductor integrated circuit.
Figure 2:
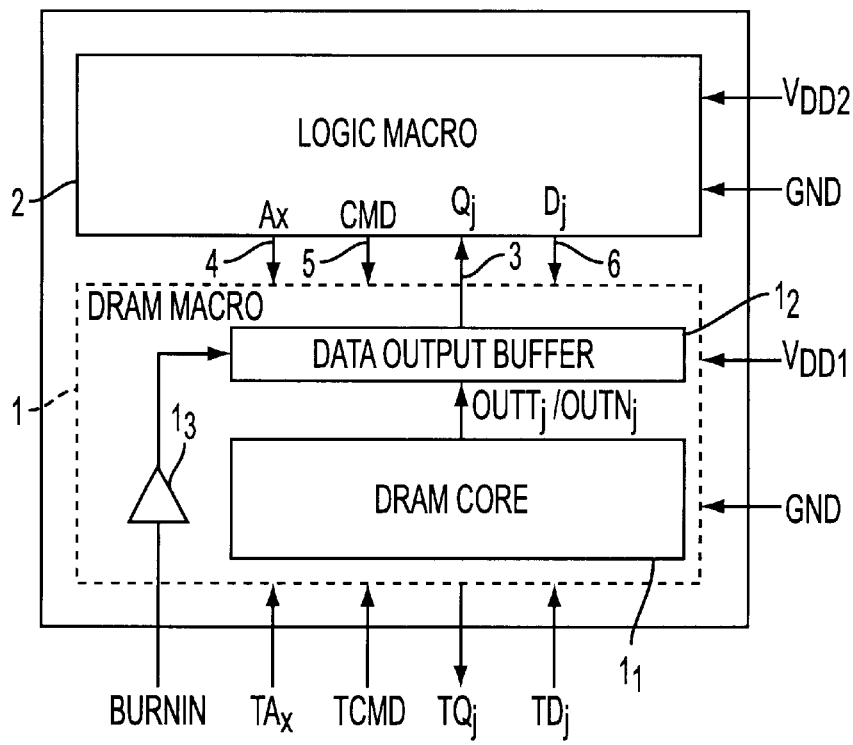
FIG. 2 is a view showing a configuration of a semiconductor integrated circuit in a first embodiment of the present invention.

FIG. 2 shows the configuration of a semiconductor integrated circuit in a first embodiment of the present invention. The semiconductor integrated circuit has a DRAM macro 1 and a logic macro 2. An output of the DRAM macro 1 is connected through a data output signal line 3 to an input of the logic macro 2. An output of the logic macro 2 is connected through an address signal line 4, a command signal line 5 and a data input signal line 6 to an input of the DRAM macro 1.

A power supply voltage $V_{DD1}$ is sent to the DRAM macro 1. The power supply voltage $V_{DD1}$ is 2.5 V at a time of a normal operation. It is 4.5 V higher than that of the normal operation when the burn-in is performed on the semiconductor integrated circuit.

A burn-in indication signal BURNIN is inputted to the DRAM macro 1. The burn-in indication signal BURNIN indicates to the DRAM macro 1 whether or not the burn-in is performed on the semiconductor integrated circuit. The burn-in indication signal BURNIN, if it is at a high level (power supply voltage), indicates that the burn-in is performed on the semiconductor integrated circuit. The burn-in indication signal BURNIN, if it is at a low level (ground level), indicates that the burn-in is not performed on the semiconductor integrated circuit.

Moreover, an address signal Ax, a command signal CMD and an input data $D_j$ are inputted through the address signal line 4, the command signal line 5 and the data input signal line 6, respectively, to the DRAM macro 1. The DRAM macro 1 fetches the input data $D_j$ in response to the address signal Ax and the command signal CMD. Moreover, in response to the address signal Ax and the command signal CMD, the DRAM macro 1 outputs the data stored by it, as an output data signal $Q_j$, to the logic macro 2. An output of the output data signal $Q_j$ is done via the data output signal line 3.

The DRAM macro 1 contains a DRAM core $1_1$, a data output buffer $1_2$ and an input buffer $1_3$. The DRAM core $1_1$ is the portion in the DRAM macro 1 for actually storing a data. The DRAM core $1_1$ outputs the data stored by it, as a complementary output data signal $OUTT_j/OUTN_j$, to the data output buffer $1_2$.

The burn-in indication signal BURNIN is inputted through the input buffer $1_3$ to the data output buffer $1_2$. The data output buffer $1_2$ refers to the burn-in indication signal BURNIN, and carries out a different operation, depending on whether or not the burn-in is performed on the semiconductor integrated circuit.

When the semiconductor integrated circuit carries out the normal operation, the data output buffer $1_2$ outputs a data identical to a data inputted through the complementary output data signal $OUTT_j/OUTN_j$, as the output data signal $Q_j$ to the data output signal line 3.

On the other hand, if the burn-in is performed on the semiconductor integrated circuit, the data output buffer $1_2$ outputs the output data signal $Q_j$ as the low level, in response to the burn-in indication signal BURNIN. Thus, even if a high power supply voltage is sent to the DRAM macro 1 when the burn-in is performed, a signal having the same amplitude as the power supply voltage is never outputted as the output data signal $Q_j$ to the logic macro 2. Hence, when the burn-in is performed on the semiconductor integrated circuit, it is possible to protect the break of the semiconductor element included in the logic macro 2.

The output data signal $Q_j$ outputted by the data output buffer $1_2$ is inputted to the logic macro 2.

A power supply voltage $V_{DD2}$ is sent to the logic macro 2. The power supply voltage $V_{DD2}$ is set to 2.5 V equal to that of the DRAM macro 1 when the semiconductor integrated circuit carries out the normal operation. On the other hand, if the burn-in is performed on the semiconductor integrated circuit, the power supply voltage $V_{DD2}$ is set to 3.5 V. The maximum rated voltage of the logic macro 2 is 4.0 V.

The logic macro 2 generates the address signal Ax, the command signal CMD and the input data signal $D_j$, and controls the operation of the DRAM macro 1. Moreover, the logic macro 2 carries out a predetermined logical process on the basis of the output data signal $Q_j$ inputted to it.

The operation when the semiconductor integrated circuit in the first embodiment carries out the normal operation and the operation when the burn-in is performed are described in succession.

When the semiconductor integrated circuit carries out the normal operation, the power supply voltage $V_{DD1}$ sent to the DRAM macro 1 and the power supply voltage $V_{DD2}$ sent to the logic macro 2 are both set to 2.5 V. Moreover, the burn-in indication signal BURNIN is set at the low level. The DRAM macro 1 recognizes that the normal operation being done, from the burn-in indication signal BURNIN.

The DRAM macro 1 outputs the data stored in the DRAM core $1_1$ as the output data signal $Q_j$. An amplitude of the output data signal $Q_j$ is 2.5 V equal to the power supply voltage $V_{DD1}$ sent to the DRAM macro 1, and it is lower than the maximum rated voltage of the logic macro 2.

On the other hand, if the burn-in is performed on the semiconductor integrated circuit, the power supply voltage $V_{DD1}$ sent to the DRAM macro 1 is set to 4.5 V, and the power supply voltage $V_{DD2}$ sent to the logic macro 2 is set to 3.5 V. The power supply voltage $V_{DD1}$ sent to the DRAM macro 1 exceeds the maximum rated voltage of the logic macro 2.

If the burn-in is performed on the semiconductor integrated circuit, the burn-in indication signal BURNIN is set at the high level. The DRAM macro 1 recognizes that the burn-in is performed on the semiconductor integrated circuit, from the burn-in indication signal BURNIN.

The data output buffer $1_2$ sets the output data signal $Q_j$ at the low level, in response to the burn-in indication signal BURNIN. Thus, even if the power supply voltage $V_{DD1}$ exceeding the maximum rated voltage of the logic macro 2 is sent to the DRAM macro 1, the signal having the amplitude exceeding the maximum rated voltage of the logic macro 2 is never sent to the logic macro 2 from the DRAM macro 1 as the output data signal $Q_j$. Hence, during the burn-in operation, even if the power supply voltage $V_{DD1}$ exceeding the maximum rated voltage of the logic macro 2 is sent to the DRAM macro 1, the semiconductor element included in the logic macro 2 is never broken.

By the way, in the semiconductor integrated circuit of the first embodiment, when the burn-in is performed on the semiconductor integrated circuit, the data output signal line 3 through which the output data signal $Q_j$ is transmitted can be set at the high impedance state, instead of the manner of setting the output data signal $Q_j$ at the low level.

However, if the data output signal line 3 is set at the high impedance state, the potential of the data output signal line 3 is unstable to thereby bring about the possibility that the logic macro 2 carries out an erroneous operation. Thus, such as this embodiment, if the burn-in is performed on the semiconductor integrated circuit, the output data signal $Q_j$ is desired to be set at the low level.

Also, the semiconductor integrated circuit in the first embodiment is designed so as to have the DRAM macro 1 and the logic macro 2. However, the DRAM macro 1 and the logic macro 2 may be typical two macros. In this case, the output data signal $Q_j$ is the signal outputted from one of the two macros to the other macro. Also in this case, if the burn-in is performed on the semiconductor integrated circuit, the output data signal $Q_j$ is set at the low level. Thus, the semiconductor element included in the other macro is never broken when the burn-in is done.

(Second Embodiment)

Figure 3:
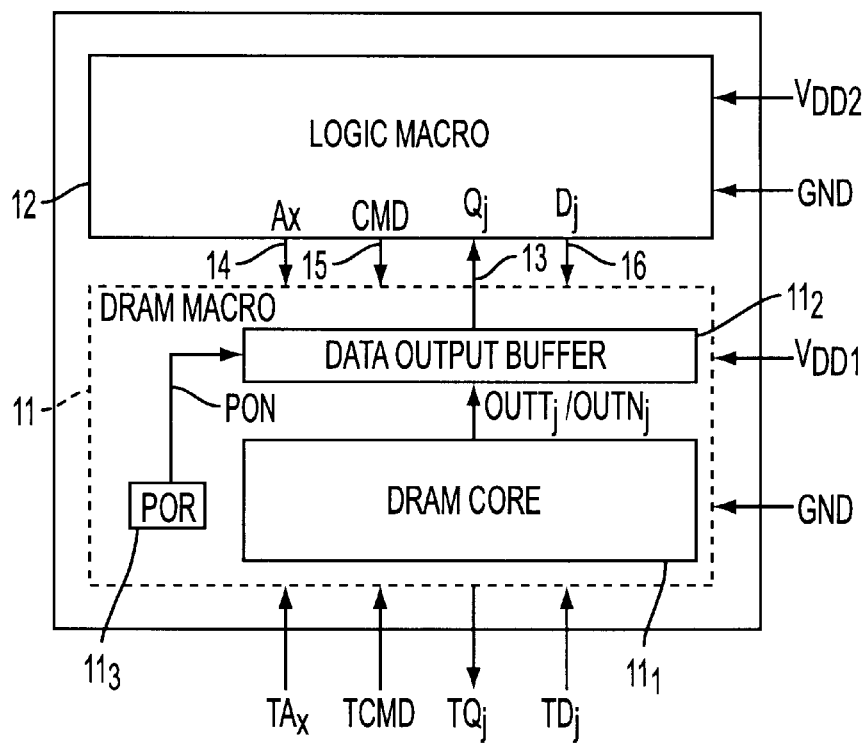
FIG. 3 is a view showing a configuration of a semiconductor integrated circuit in a second embodiment of the present invention.

FIG. 3 shows the configuration of a semiconductor integrated circuit in a second embodiment of the present invention. The semiconductor integrated circuit has the mechanism of protecting an erroneous operation from occurring immediately after the power supply is turned on. The semiconductor integrated circuit in the second embodiment differs from the semiconductor integrated circuit in the first embodiment, in this mechanism.

The semiconductor integrated circuit in the second embodiment has a DRAM macro 11 and a logic macro 12. An output of the DRAM macro 11 is connected through a data output signal line 13 to an input of the logic macro 12. An output of the logic macro 12 is connected through an address signal line 14, a command signal line 15 and a data input signal line 16 to an input of the DRAM macro 11.

A power supply voltage $V_{DD1}$ is sent to the DRAM macro 11 The power supply voltage $V_{DD1}$ is 2.5 V at the time of the normal operation. It is 4.5 V higher than that of the normal operation when the burn-in is performed on the semiconductor integrated circuit.

An address signal Ax, a command signal CMD and an input data $D_j$ are inputted through the address signal line 14, the command signal line 15 and the data input signal line 16, respectively, to the DRAM macro 11. The DRAM macro 11 fetches the input data $D_j$ in response to the address signal Ax and the command signal CMD. Moreover, in response to the address signal Ax and the command signal CMD, the DRAM macro 11 outputs the data stored by it, as an output data signal $Q_j$, to the logic macro 12. An output of the output data signal $Q_j$ is done via the data output signal line 13.

The DRAM macro 11 contains a DRAM core $11_1$, a data output buffer $11_2$ and a POR circuit $11_3$. The DRAM core $11_1$ is the portion in the DRAM macro 11 for actually storing a data. The DRAM core $11_1$ outputs the data stored by it, as a complementary output data signal OUTT$_j$/OUTN$_j$, to the data output buffer $11_2$.

On the other hand, the POR circuit $11_3$ monitors the power supply voltage $V_{DD1}$ sent to the DRAM macro 11. The POR circuit $11_3$, if the power supply voltage $V_{DD1}$ is lower than a predetermined standard voltage $V_{std1}$, sets a power-on signal PON at the low level, and outputs it. The POR circuit $11_3$, if the power supply voltage $V_{DD1}$ is higher than the predetermined standard voltage $V_{std1}$, sets the power-on signal PON at the high level, and outputs it.

The data output buffer $11_2$ carries out the different operation, depending on whether or not the power-on signal PON is at the high level, namely, whether or not the power supply voltage $V_{DD1}$ is higher than the predetermined standard voltage $V_{std1}$.

If the power supply voltage $V_{DD1}$ is higher than the predetermined standard voltage $V_{std1}$, the data output buffer $11_2$ outputs a data identical to a data inputted through the complementary output data signal $OUTT_j/OUTN_j$, as the output data signal $Q_j$ to the data output signal line 13. That is, the data output buffer $11_2$ outputs the data stored by the DRAM core $11_1$, as the output data signal $Q_j$ to the data output signal line 13.

On the other hand, if the power supply voltage $V_{DD1}$ is lower than the predetermined standard voltage $V_{std1}$, the data output buffer $11_2$ outputs the output data signal $Q_j$ as the low level. Thus, when the power supply to the semiconductor integrated circuit is turned on, it is possible to protect the logic macro 12 from carrying out an erroneous operation.

The output data signal $Q_j$ outputted by the data output buffer $11_2$ is inputted to the logic macro 12.

A power supply voltage $V_{DD2}$ is sent to the logic macro 12. The power supply voltage $V_{DD2}$ is set to 2.5 V equal to that of the DRAM macro 11 when the semiconductor integrated circuit carries out the normal operation. On the other hand, if the burn-in is performed on the semiconductor integrated circuit, the power supply voltage $V_{DD2}$ is set to 3.5 V. The maximum rated voltage of the logic macro 12 is 4.0 V.

The logic macro 12 generates the address signal Ax, the command signal CMD and the input data signal $D_j$, and controls the operation of the DRAM macro 11. Moreover, the logic macro 12 carries out a predetermined logical process on the basis of the output data signal $Q_j$ inputted to it.

The operation of the semiconductor integrated circuit in the second embodiment is described in succession.

As shown in FIG. 4A, let us suppose that a power supply to the semiconductor integrated circuit is turned on at a time t=0, and the power supply voltage $V_{DD1}$ sent to the DRAM macro 11 begins to rise. As shown in FIG. 4B, if the power supply voltage $V_{DD1}$ is lower than the predetermined standard voltage $V_{std1}$, the power-on signal PON outputted by the POR circuit $11_3$ is set at the low level. The data output buffer $11_2$ sets the output data signal $Q_j$ at the low level, in response to the fact that the power-on signal PON is at the low level, and then outputs it.

As shown in FIG. 4A, after that, let us suppose that the power supply voltage $V_{DD1}$ exceeds the standard voltage $V_{std1}$ at a time $t=t_1$. As shown in FIG. 4B, at this time, the power-on signal PON becomes at the high level. As shown in FIG. 4C, the data output buffer $11_2$ outputs the data stored by the DRAM core $11_1$ to the logic macro 12 through the output data signal $Q_j$, under the instructions of the address signal Ax and the command signal CMD outputted by the logic macro 12, in response to the fact that the power-on signal PON is at the high level.

In the semiconductor integrated circuit of the second embodiment, if the power supply voltage $V_{DD1}$ is lower than the predetermined standard voltage $V_{std1}$, the output data signal $Q_j$ outputted by the DRAM macro 11 is set at the low level. The erroneous operation in the logic macro 12 is never brought about, even if the operation in the DRAM macro 11 is unstable under the condition that the power supply voltage $V_{DD1}$ is low immediately after the power supply to the semiconductor integrated circuit is turned on.

That is, it takes a certain time for the power supply voltage $V_{DD1}$ sent to the DRAM macro 11 to reach the power supply voltage necessary for the operation of the DRAM macro 11, after the power supply to the semiconductor integrated circuit is turned on. At this time, the operation of the DRAM macro 11 is unstable until the power supply voltage $V_{DD1}$ reaches a certain degree of a voltage. Thus, there may be a fear that a data which is not assumed to be inputted to the logic macro 12 is outputted to the logic macro 12 through the output data signal $Q_j$. However, the data output buffer $11_2$, if the power supply voltage $V_{DD1}$ is lower than the predetermined standard voltage $V_{std1}$, outputs the output data signal $Q_j$ as the low level. Hence, the logic macro 12 is never erroneously operated, even if the operation of the DRAM macro 11 is unstable immediately after the power supply to the semiconductor integrated circuit is turned on.

By the way, in the second embodiment, if the power supply voltage $V_{DD1}$ is lower than the standard voltage $V_{std1}$, it is possible to set the data output signal line 13, through which the output data signal $Q_j$ is sent, at the high impedance state without setting the output data signal $Q_j$ at the low level.

The semiconductor integrated circuit in the second embodiment is configured so as to have the DRAM macro 11 and the logic macro 12. However, the DRAM macro 11 and the logic macro 12 may be the typical two macros. In this case, the output data signal $Q_j$ is the signal outputted from one of the two macros to the other macro. Also in this case, if the power supply voltage sent to one of the two macros is lower than the predetermined standard voltage, the output data signal $Q_j$ is set at the low level Thus, it is possible to protect the other macro from being erroneously operated.

Moreover, in the semiconductor integrated circuit of the second embodiment, the POR circuit $11_3$ is mounted inside the DRAM macro 11. However, of course, the POR circuit $11_3$ can be mounted outside the DRAM macro 11.

(Third Embodiment)

Figure 5:
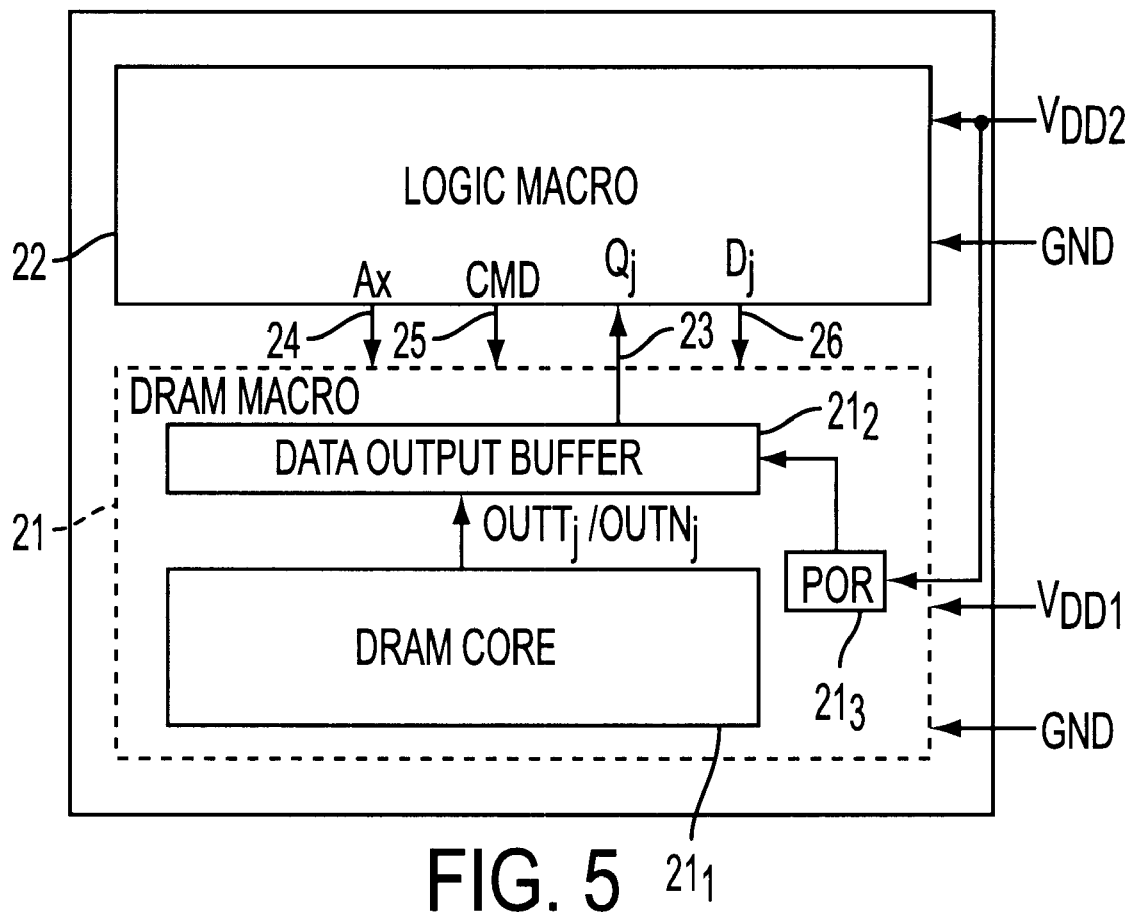
FIG. 5 is a view showing a configuration of a semiconductor integrated circuit in a third embodiment of the present invention.

FIG. 5 shows the configuration of a semiconductor integrated circuit in a third embodiment of the present invention. The semiconductor integrated circuit has the mechanism of protecting the erroneous operation from occurring immediately after the power supply is turned on, similarly to the semiconductor integrated circuit in the second embodiment. However, the semiconductor integrated circuit in the third embodiment differs from the semiconductor integrated circuit in the second embodiment, in a manner that an output data signal outputted from a DRAM macro is set at the low level, in response to a power supply voltage sent to a logic macro.

The semiconductor integrated circuit has a DRAM macro 21 and a logic macro 22. An output of the DRAM macro 21 is connected through a data output signal line 23 to an input of the logic macro 22. An output of the logic macro 22 is connected through an address signal line 24, a command signal line 25 and a data input signal line 26 to an input of the DRAM macro 21.

A power supply voltage $V_{DD1}$ is sent to the DRAM macro 21. The power supply voltage $V_{DD1}$ is 2.5 V at the time of the normal operation. It is 4.5 V higher than that of the normal operation when the burn-in is performed on the semiconductor integrated circuit.

A power supply voltage $V_{DD2}$ is sent to the logic macro 22. The power supply voltage $V_{DD2}$ is 2.5 V at the time of the normal operation. It is 3.5 V higher than that of the normal operation when the burn-in is performed on the semiconductor integrated circuit.

An address signal Ax, a command signal CMD and an input data $D_j$ are inputted through the address signal line 24, the command signal line 25 and the data input signal line 26, respectively, to the DRAM macro 21. The DRAM macro 21 fetches the input data $D_j$ in response to the address signal Ax and the command signal CMD. Moreover, in response to the address signal Ax and the command signal CMD, the DRAM macro 21 outputs the data stored by it, as an output data signal $Q_j$ to the logic macro 22. An output of the output data signal $Q_j$ is done via the data output signal line 23.

The DRAM macro 21 contains a DRAM core $21_1$ a data output buffer $21_2$ and a POR circuit $21_3$. The DRAM core $21_1$ is the portion in the DRAM macro 21 for actually storing a data. The DRAM core $21_1$ outputs the data stored by it, as a complementary output data signal $OUTT_j/OUTN_j$, which is inputted to the data output buffer $21_2$.

On the other hand, the POR circuit $21_3$ monitors the power supply voltage $V_{DD2}$ sent to the logic macro 22. The POR circuit 213, if the power supply voltage $V_{DD2}$ is lower than a predetermined standard voltage $V_{std2}$, sets a power-on signal PON at the low level, and outputs it. The POR circuit $21_3$, if the power supply voltage $V_{DD2}$ is higher than the predetermined standard voltage $V_{std2}$, sets the power-on signal PON at the high level, and outputs it.

The data output buffer $21_2$ carries out the different operation, depending on whether or not the power-on signal PON is at the high level, namely, whether or not the power supply voltage $V_{DD2}$ sent to the logic macro 22 is higher than the predetermined standard voltage $V_{std2}$.

If the power supply voltage $V_{DD2}$ is higher than the predetermined standard voltage $V_{std2}$, the data output buffer $21_2$ outputs a data identical to a data inputted through the complementary output data signal $OUTT_j/OUTN_j$, as the output data signal $Q_j$ to the data output signal line 23. That is, the data output buffer $21_2$ outputs the data stored by the DRAM core $21_1$, as the output data signal $Q_j$ to the data output signal line 23.

On the other hand, if the power supply voltage $V_{DD2}$ is lower than the predetermined standard voltage $V_{std2}$, the data output buffer $21_2$ outputs the output data signal $Q_j$ as the low level. Thus, when the power supply to the semiconductor integrated circuit is turned on, it is possible to protect the logic macro 22 from carrying out an erroneous operation.

That is, it takes a certain time for the power supply voltage $V_{DD2}$ sent to the logic macro 22 to reach the power supply voltage necessary for the operation of the DRAM macro 22, after the power supply to the semiconductor integrated circuit is turned on. At this time, if the output data signal $Q_j$ is inputted until the power supply voltage $V_{DD2}$ reaches a certain degree of a voltage, there may be a fear that an improper voltage is applied to a semiconductor element included in the logic macro 22, and a latch-up state is induced in the logic macro 22. However, the data output buffer $21_2$, if the power supply voltage $V_{DD2}$ is lower than the predetermined standard voltage $V_{std2}$, outputs the output data signal $Q_j$ as the low level. Thus, it is possible to protect the latch-up state from being induced in the logic macro 22.

The output data signal $Q_j$ outputted by the data output buffer $21_2$ is inputted to the logic macro 22.

The logic macro 22 generates the address signal Ax, the command signal CMD and the input data signal $D_j$, and controls the operation of the DRAM macro 21. Moreover, the logic macro 22 carries out a predetermined logical process on the basis of the output data signal $Q_j$ inputted to it.

The operation of the semiconductor integrated circuit in the third embodiment is described in succession.

Figure 6A:
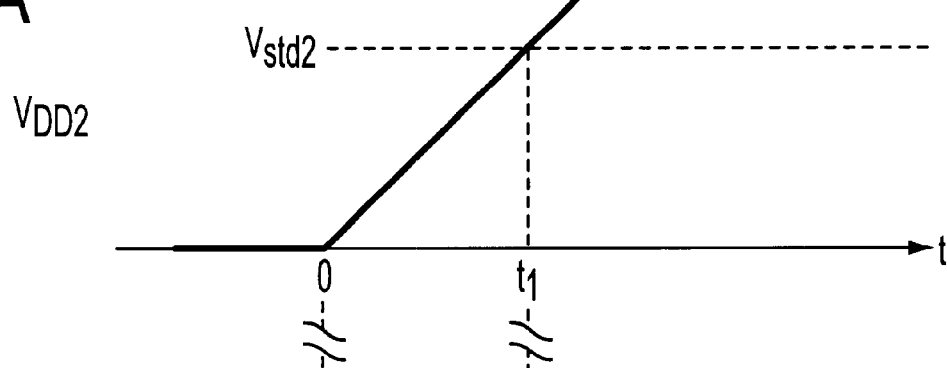
FIG. 6A is a view showing a part of an operation of the semiconductor integrated circuit in the third embodiment.
Figure 6B:
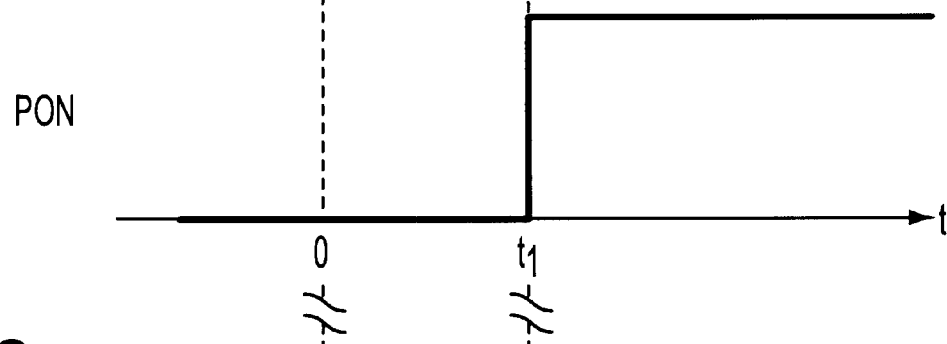
FIG. 6B is a view showing another part of an operation of the semiconductor integrated circuit in the third embodiment.

As shown in FIG. 6A, let us suppose that a power supply to the semiconductor integrated circuit is turned on at a time t=0, and the power supply voltage $V_{DD2}$ sent to the logic macro 22 begins to rise. As shown in FIG. 6B, if the power supply voltage $V_{DD2}$ is lower than the predetermined standard voltage $V_{std2}$, the power-on signal PON outputted by the POR circuit $21_3$ is set at the low level. The data output buffer $21_2$ sets the output data signal $Q_j$ at the low level, in response to the fact that the power-on signal PON is at the low level, and then outputs it.

Figure 6C:
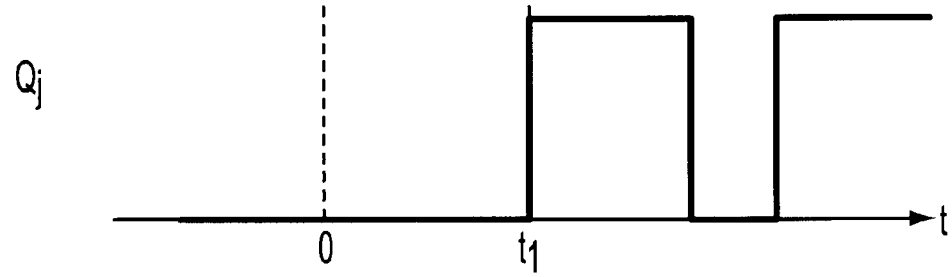
FIG. 6C is a view showing still another part of an operation of the semiconductor integrated circuit in the third embodiment.

As shown in FIG. 6A, after that, let us suppose that the power supply voltage $V_{DD2}$ exceeds the standard voltage $V_{std2}$ at a time $t=t_1$. At this time, the power-on signal PON becomes at the high level. As shown in FIG. 6C, the data output buffer $21_2$ outputs the data stored by the DRAM core $21_1$ to the logic macro 22 through the output data signal $Q_j$, under the instructions of the address signal Ax and the command signal CMD outputted by the logic macro 22, in response to the fact that the power-on signal PON is at the high level.

In the semiconductor integrated circuit of the third embodiment, if the power supply voltage $V_{DD2}$ is lower than the predetermined standard voltage $V_{std2}$, the output data signal $Q_j$ outputted by the DRAM macro 21 is fixed at the low level. The latch-up state in the logic macro 22 is never brought about, even if the output data signal $Q_j$ is inputted to the logic macro 22 under the condition that the power supply voltage $V_{DD2}$ is low immediately after the power supply to the semiconductor integrated circuit is turned on.

By the way, in the third embodiment, if the power supply voltage $V_{DD2}$ is lower than the standard voltage $V_{std2}$, it is possible to set the data output signal line 23, through which the output data signal $Q_j$ is sent, at the high impedance state without setting the output data signal $Q_j$ at the low level.

Also in the third embodiment, the POR circuit $21_3$ can further monitor the power supply voltage $V_{DD1}$ sent to to the DRAM macro 21, in addition to the power supply voltage $V_{DD2}$ sent to the logic macro 22. At this time, if the power supply voltage $V_{DD1}$ is higher than the predetermined standard voltage $V_{std1}$ and the power supply voltage $V_{DD2}$ is higher than the predetermined standard voltage $V_{std2}$, the DRAM macro 21 outputs the data stored by the DRAM core $21_1$, to the logic macro 22 through the output data signal $Q_j$. Thus, it is possible to simultaneously protect the logic macro 22 from being erroneously operated, even if the operation of the DRAM macro 21 is unstable under the condition that the power supply voltage $V_{DD1}$ is low immediately after the power supply to the semiconductor integrated circuit is turned on.

Similarly to the semiconductor integrated circuits in the first and second embodiments, in the semiconductor integrated circuit of the third embodiment, the DRAM macro 1 and the logic macro 2 can be substituted for the typical two macros.

(Fourth Embodiment)

Figure 7:
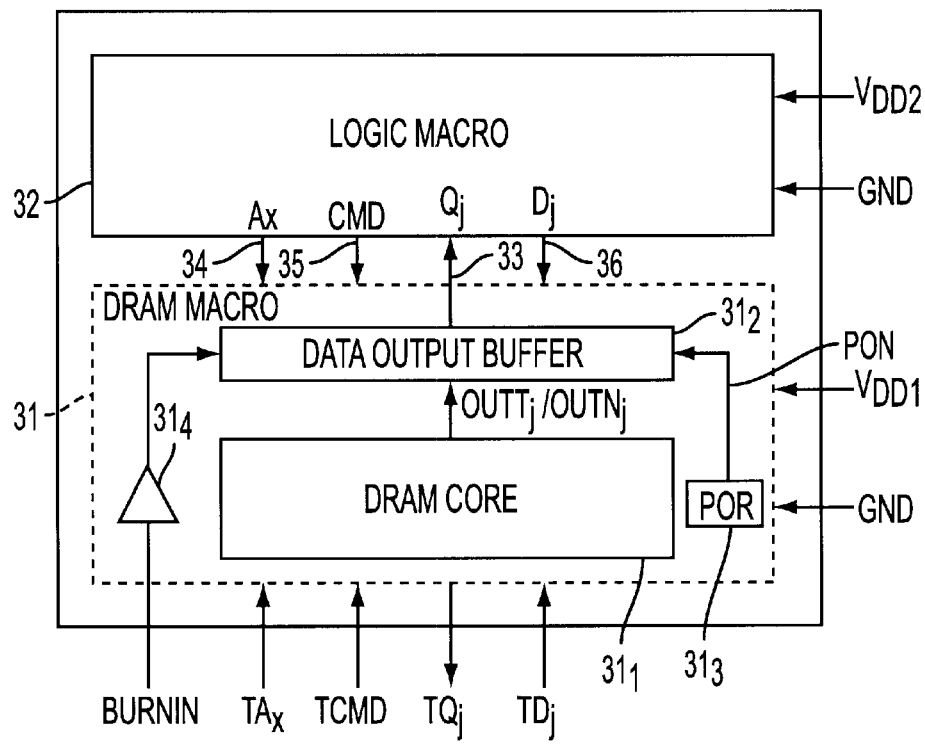
FIG. 7 is a view showing a configuration of a semiconductor integrated circuit in a fourth embodiment of the present invention.

FIG. 7 shows the configuration of a semiconductor integrated circuit in a fourth embodiment of the present invention. The semiconductor integrated circuit is designed similarly to the semiconductor integrated circuit in the first embodiment. That is, while the burn-in is performed, even if the power supply voltage exceeding the maximum rated voltage of the logic macro is sent to the DRAM macro, the semiconductor element included in the logic macro is never broken. Moreover, this has the mechanism of protecting the erroneous operation from occurring immediately after the power supply is turned on, similarly to the semiconductor integrated circuit in the second embodiment.

The semiconductor integrated circuit has a DRAM macro 31 and a logic macro 32. An output of the DRAM macro 31 is connected through a data output signal line 33 to an input of the logic macro 32. An output of the logic macro 32 is connected through an address signal line 34, a command signal line 35 and a data input signal line 36 to an input of the DRAM macro 31.

A power supply voltage $V_{DD1}$ is sent to the DRAM macro 31. The power supply voltage $V_{DD1}$ is 2.5 V at the time of the normal operation. It is 4.5 V higher than that of the normal operation when the burn-in is performed on the semiconductor integrated circuit.

An address signal Ax, a command signal CMD and an input data $D_j$ are inputted through the address signal line 34, the command signal line 35 and the data input signal line 36, respectively, to the DRAM macro 31. The DRAM macro 31 fetches the input data signal $D_j$ in response to the address signal Ax and the command signal CMD. Moreover, in response to the address signal Ax and the command signal CMD, the DRAM macro 31 outputs the data stored by it, through an output data signal $Q_j$, to the logic macro 32. An output of the output data signal $Q_j$ is done via the data output signal line 33.

A burn-in indication signal BURNIN is inputted to the DRAM macro 31. The burn-in indication signal BURNIN indicates to the DRAM macro 31 whether or not the burn-in is performed on the semiconductor integrated circuit. The burn-in indication signal BURNIN, if it is at the high level (power supply voltage), indicates that the burn-in is performed on the semiconductor integrated circuit. The burn-in indication signal BURNIN, if it is at the low level (ground level), indicates that the burn-in is not performed on the semiconductor integrated circuit.

The DRAM macro 31 contains a DRAM core $31_1$, a data output buffer $31_2$, a POR circuit $31_3$ and an input buffer $31_4$. The DRAM core $31_1$ contains a memory cell for storing a data. The DRAM core $31_1$ outputs the data stored by it, as a complementary output data signal $OUTT_j/OUTN_j$, which is inputted to the data output buffer $31_2$.

On the other hand, the POR circuit $31_3$ monitors the power supply voltage $V_{DD1}$ sent to the DRAM macro 31. The POR circuit $31_3$, if the power supply voltage $V_{DD1}$ is lower than a predetermined standard voltage $V_{std1}$, sets a power-on signal PON at the low level, and outputs it. The POR circuit $31_3$, if the power supply voltage $V_{DD1}$ is higher than the predetermined standard voltage $V_{std1}$, it sets the power-on signal PON at the high level, and outputs it.

The data output buffer $31_2$ carries out an operation, in response to both the power-on signal PON and the burn-in indication signal BURNIN.

If the semiconductor integrated circuit carries out the normal operation and if the power supply voltage $V_{DD1}$ is higher than the predetermined standard voltage $V_{std1}$, the data output buffer $31_2$ outputs a data identical to a data inputted through the complementary output data signal $OUTT_j/OUTN_j$, as the output data signal $Q_j$ to the data output signal line 33. That is, the data output buffer $31_2$ outputs the data stored by the DRAM core $31_1$, as the output data signal $Q_j$ to the data output signal line 33.

On the other hand, if the power supply voltage $V_{DD1}$ is lower than the predetermined standard voltage $V_{std1}$, or if the burn-in is performed on the semiconductor integrated circuit, the data output buffer $31_2$ outputs the output data signal $Q_j$ as the low level. Accordingly, even if a high power supply voltage is sent to the DRAM macro 31 when the burn-in is performed, a signal having an amplitude exceeding the maximum rated voltage is inputted as the output data signal $Q_j$ to the logic macro 32. Thus, the semiconductor element included in the logic macro 32 is never broken. Moreover, when the power supply to the semiconductor integrated circuit is turned on, it is possible to protect the logic macro 32 from carrying out an erroneous operation.

The output data signal $Q_j$ outputted by the data output buffer $31_2$ is inputted to the logic macro 32. A power supply voltage $V_{DD2}$ is sent to the logic macro 32. The power supply voltage $V_{DD2}$ is 2.5 V in the normal operation. If the burn-in is performed on the semiconductor integrated circuit, it is 3.5 V higher than that of the normal operation. The maximum rated voltage of the logic macro 32 is 4.0 V.

The logic macro 32 generates the address signal Ax, the command signal CMD and the input data signal $D_j$, and controls the operation of the DRAM macro 31. Moreover, the logic macro 32 carries out a predetermined logical process on the basis of the output data signal $Q_j$ inputted to it.

The operation of the semiconductor integrated circuit in the fourth embodiment is described in succession.

At fist, the case in which the burn-in is performed on the semiconductor integrated circuit is described. If the burn-in is performed on the semiconductor integrated circuit, the power supply voltage $V_{DD1}$ sent to the DRAM macro 31 is set to 4.5 V, and the power supply voltage $V_{DD2}$ sent to the logic macro 32 is set to 3.5 V. The power supply voltage $V_{DD1}$ sent to the DRAM macro 31 exceeds the maximum rated voltage of the logic macro 32.

If the burn-in is performed on the semiconductor integrated circuit, the burn-in indication signal BURNIN is set at the high level. The DRAM macro 31 recognizes that the burn-in is performed on the semiconductor integrated circuit, from the burn-in indication signal BURNIN.

The data output buffer $31_2$ sets the output data signal $Q_j$ at the low level, in response to the burn-in indication signal BURNIN. Thus, even if the power supply voltage $V_{DD1}$ exceeding the maximum rated voltage of the logic macro 32 is sent to the DRAM macro 31, the signal having the amplitude exceeding the maximum rated voltage of the logic macro 32 is never sent to the logic macro 32 from the DRAM macro 31 as the output data signal $Q_j$. Hence, during the burn-in operation, even if the power supply voltage $V_{DD1}$ exceeding the maximum rated voltage of the logic macro 32 is sent to the DRAM macro 31, the semiconductor element included in the logic macro 32 is never broken.

The operation when the power supply to the semiconductor integrated circuit in the fourth embodiment is described in succession. Let us suppose that the power supply to the semiconductor integrated circuit is turned on, and the power supply voltage $V_{DD1}$ sent to the DRAM macro 11 begins to rise. If the power supply voltage $V_{DD1}$ is lower than the predetermined standard voltage $V_{std1}$, the power-on signal PON outputted by the POR circuit $31_3$ is set at the low level. The data output buffer $31_2$ sets the output data signal $Q_j$ at the low level, in response to the fact that the power-on signal PON is at the low level, and then outputs it.

After that, let us suppose that the power supply voltage $V_{DD1}$ exceeds the standard voltage $V_{std1}$. At this time, the power-on signal PON becomes at the high level. The data output buffer $31_2$ outputs the data stored by the DRAM core $31_1$ to the logic macro 32 through the output data signal $Q_j$, under the instructions of the address signal Ax and the command signal CMD outputted by the logic macro 32, in response to the fact that the power-on signal PON is at the high level.

In the semiconductor integrated circuit, if the power supply voltage $V_{DD1}$ is lower than the predetermined standard voltage $V_{std1}$, the output data signal $Q_j$ outputted by the DRAM macro 31 is set at the low level. The erroneous operation in the logic macro 32 is never brought about, even if the operation in the DRAM macro 31 is unstable under the condition that the power supply voltage $V_{DD1}$ is low immediately after the power supply to the semiconductor integrated circuit is turned on.

As mentioned above, in the semiconductor integrated circuit of the fourth embodiment, during the burn-in operation, even if the power supply voltage $V_{DD1}$ exceeding the maximum rated voltage of the logic macro 32 is sent to the DRAM macro 31, the semiconductor element included in the logic macro 32 is never broken. Moreover, the unstable operation of the DRAM macro 31 immediately after the power supply to the semiconductor integrated circuit is turned on does not cause the logic macro 32 from being erroneously operated.

By the way, in the semiconductor integrated circuit of the fourth embodiment, the POR circuit $31_3$ can carry out the operation while monitoring the power supply voltage $V_{DD2}$ of the logic macro 32, instead of the power supply voltage $V_{DD1}$ of the DRAM macro 31, similarly to the semiconductor integrated circuit in the third embodiment. In such a case, if the power supply voltage $V_{DD2}$ of the logic macro 32 is lower than the predetermined standard voltage $V_{std2}$, the output data signal $Q_j$ is set at the low level In the semiconductor integrated circuit of the fourth embodiment, it can further carry out the operation while monitoring the power supply voltage $V_{DD2}$ of the logic macro 32, in addition to the power supply voltage $V_{DD1}$ of the DRAM macro 31. At this time, if the power supply voltage $V_{DD1}$ of the DRAM macro 31 is lower than the predetermined standard voltage $V_{std1}$, or if the power supply voltage $V_{DD2}$ of the logic macro 32 is lower than the predetermined standard voltage $V_{std2}$, the output data signal $Q_j$ is set at the low level.

Also in the semiconductor integrated circuit of the fourth embodiment, the data output signal line 3 through which the output data signal $Q_j$ is sent can be set at the high impedance state, instead of the manner that the output data signal $Q_j$ is set at the low level, or when the burn-in is performed on the semiconductor integrated circuit.

Similarly to the semiconductor integrated circuits in the first to third embodiments, in the semiconductor integrated circuit of the fourth embodiment, the DRAM macro 1 and the logic macro 2 can be substituted for the typical two macros.

(Fifth Embodiment)

Figure 8:
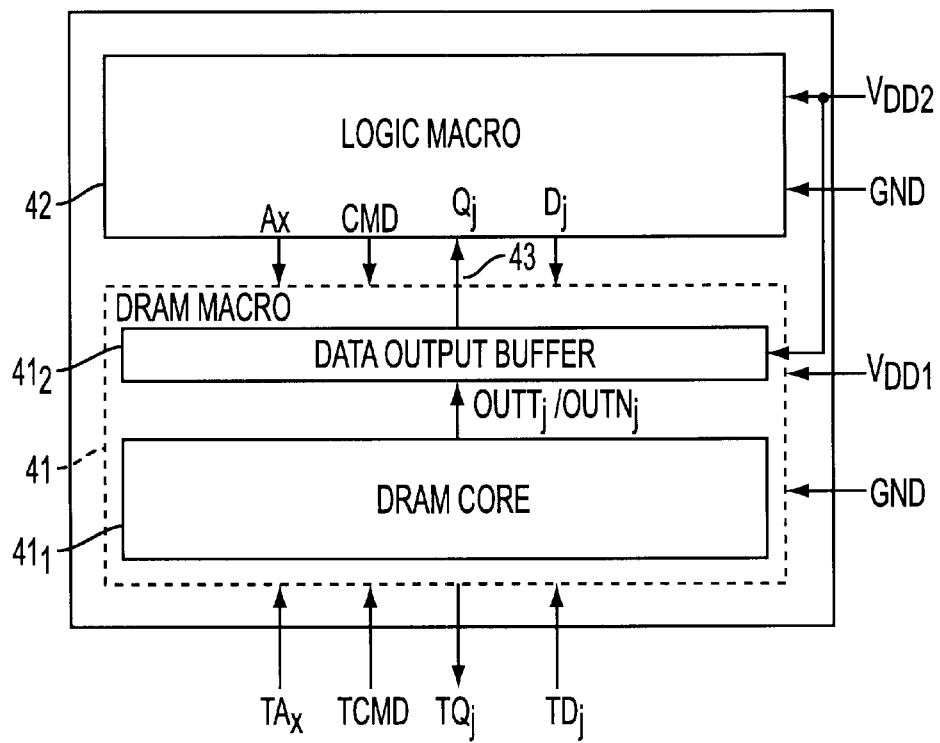
FIG. 8 is a view showing a configuration of a semiconductor integrated circuit in a fifth embodiment of the present invention.

FIG. 8 shows the configuration of a semiconductor integrated circuit in a fifth embodiment according to the present invention. The semiconductor integrated circuit differs from the semiconductor integrated circuits in the first to fourth embodiments in the manner of sending a power supply voltage.

The semiconductor integrated circuit has a DRAM macro 41 and a logic macro 42.

An address signal Ax, a command signal CMD and an input data $D_j$ are inputted to the DRAM macro 41. The DRAM macro 41 fetches the input data $D_j$ in response to the address signal Ax and the command signal CMD. Moreover, in response to the address signal Ax and the command signal CMD, the DRAM macro 41 outputs the data stored by it, as an output data signal $Q_j$, to the logic macro 32.

The DRAM macro 41 contains a DRAM core $41_1$ and a data output buffer $41_2$. The DRAM core $41_1$ is the portion in the DRAM macro 41 for actually storing a data. The DRAM core $41_1$ outputs the data stored by it, as a complementary output data signal $OUTT_j/OUTN_j$, which is inputted to the data output buffer $41_2$. The data output buffer $41_2$ outputs a data equal to that of the complementary output data signal $OUTT_j/OUTN_j$ to the logic macro 42 through the output data signal $Q_j$.

The output data signal $Q_j$ outputted by the data output buffer $41_2$ is inputted to the logic macro 42. The logic macro 42 generates the address signal Ax, the command signal CMD and the input data signal $D_j$, and controls the operation of the DRAM macro 41. Moreover, the logic macro 42 carries out a predetermined logical process on the basis of the output data signal $Q_j$ inputted to it.

A power supply voltage $V_{DD2}$ is sent to the logic macro 42, similarly to the semiconductor integrated circuits in the first to fourth embodiments. The power supply voltage $V_{DD2}$ is 2.5 V similar to the power supply voltage $V_{DD1}$ in the normal operation. If the burn-in is performed on the semiconductor integrated circuit, it is 3.5 V higher than that of the normal operation. The maximum rated voltage of the logic macro 42 is 4.0 V.

On the other hand, two different power supply potentials are sent to the DRAM macro 41. The power supply voltage $V_{DD1}$ is sent to the portions except the data output buffer $41_2$, in the DRAM macro 41. The power supply voltage $V_{DD1}$ is 2.5 V in the normal operation. If the burn-in is performed on the semiconductor integrated circuit, it is 4.5 V higher than that of the normal operation.

Moreover, the power supply voltage $V_{DD2}$ equal to that of the logic macro 42 is sent to the data output buffer $41_2$ outputting the output data signal $Q_j$ to the logic macro 42 from the DRAM macro 41. The data output buffer $41_2$ to which the power supply voltage $V_{DD2}$ is sent, while its amplitude is kept substantially similar to that of the power supply voltage $V_{DD2}$, outputs the output data signal $Q_j$.

Accordingly, when the burn-in is performed on the semiconductor integrated circuit, if the voltage exceeding 4.0 V that is the maximum rated voltage of the logic macro 42 is sent to the DRAM macro 41 as the power supply voltage $V_{DD1}$, the amplitude of the output data signal $Q_j$ is suppressed to 3.5 V equal to the power supply voltage $V_{DD2}$. Thus, if the burn-in is performed on the semiconductor integrated circuit, the logic macro 42 is never broken.

By the way, in the semiconductor integrated circuit of the fifth embodiment, the DRAM macro 41 and the logic macro 42 can be substituted for the typical two macros, similarly to the semiconductor integrated circuits in the first to fourth embodiments.

(Six Embodiment)

Figure 9:
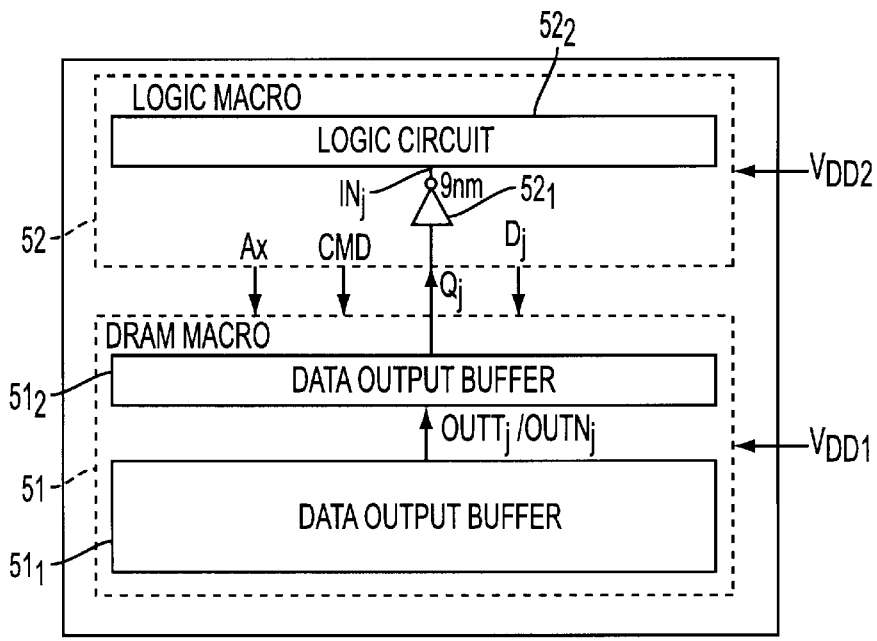
FIG. 9 is a view showing a configuration of a semiconductor integrated circuit in a sixth embodiment of the present invention.

FIG. 9 shows the configuration of a semiconductor integrated circuit according to a sixth embodiment of the present invention. The semiconductor integrated circuit has a DRAM macro 51 and a logic macro 52.

A power supply voltage $V_{DD1}$ is sent to the DRAM macro 51. The power supply voltage $V_{DD1}$ is 2.5 V at the time of the normal operation. It is 4.5 V higher than that of the normal operation when the burn-in is performed on the semiconductor integrated circuit.

The DRAM macro 51 is provided with MOS transistors (not shown). A film thickness of a gate oxide film of the MOS transistor included in the DRAM macro 51 is 9 nm. The MOS transistor including the gate oxide film having the film thickness of 9 nm has no problem with regard to the reliability, even if it is operated at the power supply voltage of 4.5 V.

An address signal Ax, a command signal CMD and an input data $D_j$ are inputted to the DRAM macro 51. The DRAM macro 51 fetches the input data $D_j$ in response to the address signal Ax and the command signal CMD. Moreover, in response to the address signal Ax and the command signal CMD, the DRAM macro 51 outputs the data stored by it, as an output data signal $Q_j$, to the logic macro 52.

The DRAM macro 51 contains a DRAM core $51_1$ and a data output buffer $51_2$. The DRAM core $51_1$ is the portion in the DRAM macro 51 for actually storing a data. The DRAM core $51_1$ outputs the data stored by it, as a complementary output data signal $OUTT_j/OUTN_j$, which is inputted to the data output buffer $51_2$. The data output buffer $51_2$ outputs a data equal to that of the complementary output data signal $OUTT_j/OUTN_j$ as the output data signal $Q_j$.

An amplitude of the output data signal $Q_j$ is equal to the power supply voltage $V_{DD1}$ sent to the DRAM macro 51. That is, the amplitude of the output data signal $Q_j$ is 2.5 V in the normal operation. If the burn-in is performed on the semiconductor integrated circuit, it is 4.5 V higher than that of the normal operation. The output data signal $Q_j$ is outputted to the logic macro 52.

A power supply voltage $V_{DD2}$ is sent to the logic macro 52. The power supply voltage $V_{DD2}$ is 2.5 V in the normal operation. If the burn-in is performed on the semiconductor integrated circuit, it is 3.5 V higher than that of the normal operation.

The logic macro 52 generates the address signal Ax, the command signal CMD and the input data signal $D_j$, and controls the operation of the DRAM macro 51.

The logic macro 52 contains the data input buffer $52_1$ and the logic circuit $52_2$.

The output data signal $Q_j$ is inputted to the data input buffer $52_1$. The data input buffer $52_1$ outputs an input data signal $IN_j$ having a data substantially equal to that of the output data signal $Q_j$, to the logic circuit $52_2$. An amplitude of the input data signal $IN_j$ is equal to the power supply voltage $V_{DD2}$ sent to the logic macro 52. That is, the amplitude of the input data signal $IN_j$ is 2.5 V in the normal operation, and it is 3.5 V if the burn-in is performed on the semiconductor integrated circuit.

The input data signal $IN_j$ is inputted to the logic circuit $52_2$. The logic circuit $52_2$ carries out a predetermined logical process, in response to the input data signal $IN_j$.

The maximum rated voltage of the entire logic macro 52 is 4.0 V. However, the portion of the data input buffer $52_1$ in the logic macro 52 is designed such that it can be operated at the higher voltage. That is, a film thickness of a gate oxide film of a MOS transistor included in the data input buffer $52_1$ is thicker than a film thickness of a gate oxide film of a MOS transistor included in the logic circuit $52_2$. Actually, the film thickness of the gate oxide film of the MOS transistor included in the data input buffer $52_1$ is 9 nm, and the film thickness of the gate oxide film of the MOS transistor included in the data input buffer $52_2$ is 6 nm. Thus, the data input buffer $52_1$ is designed such that the problem of the reliability never occurs even if the output data signal $Q_j$ having an amplitude of 4.5 V is inputted when the burn-in is performed on the semiconductor integrated circuit.

The operation when the semiconductor integrated circuit in the sixth embodiment carries out the normal operation and the operation when the burn-in is performed thereon are described.

When the semiconductor integrated circuit carries out the normal operation, the power supply voltage $V_{DD1}$ sent to the DRAM macro 51 and the power supply voltage $V_{DD2}$ sent to the logic macro 52 are both set to 2.5 V.

The DRAM macro 51 outputs the data stored in the DRAM core $51_1$ as the output data signal $Q_j$. An amplitude of the output data signal $Q_j$ is 2.5 V equal to the power supply voltage $V_{DD1}$ sent to the DRAM macro 51. The logic macro 52 is never broken.

On the other hand, if the burn-in is performed on the semiconductor integrated circuit, the power supply voltage $V_{DD1}$ sent to the DRAM macro 51 is set to 4.5 V, and the power supply voltage $V_{DD2}$ sent to the logic macro 64 is set to 3.5 V.

The output data signal $Q_j$ having the amplitude of 4.5 V is inputted to the data input buffer $52_1$ of the logic macro 52. However, the data input buffer $52_1$ is provided with the MOS transistor having the film thickness of the gate oxide film that can endure the voltage of 4.5 V. The data input buffer $52_1$ is never broken. Moreover, the amplitude of the input data signal $IN_j$, outputted to the logic circuit $52_2$ from the data input buffer $52_1$ is 3.5 V equal to the power supply voltage $V_{DD2}$ sent to the logic macro 64. The logic circuit $52_2$ is also never broken.

As mentioned above, during the burn-in operation, even if the power supply voltage $V_{DD1}$ exceeding the maximum rated voltage of the logic macro 54 is sent to the DRAM macro 51, the semiconductor element included in the logic macro 54 is never broken.

The film thickness of the gate oxide film of the MOS transistor included in the data input buffer $52_1$ may be another film thickness under the condition that it is thicker than the film thickness of the gate oxide film of the MOS transistor included in the logic circuit $52_2$. However, it is desirable that the film thickness of the gate oxide film of the MOS transistor included in the data input buffer $52_1$ is substantially equal to the film thickness of the gate oxide film of the MOS transistor included in the DRAM macro 51. Thus, the MOS transistor included in the data input buffer $52_1$ and the MOS transistor included in the DRAM macro 51 can be formed in the same process.

By the way, in the semiconductor integrated circuit of the sixth embodiment, the DRAM macro 51 and it the logic macro 52 can be substituted for the typical two macros, similarly to the semiconductor integrated circuits in the first to fifth embodiments.

(Seventh Embodiment)

Figure 10:
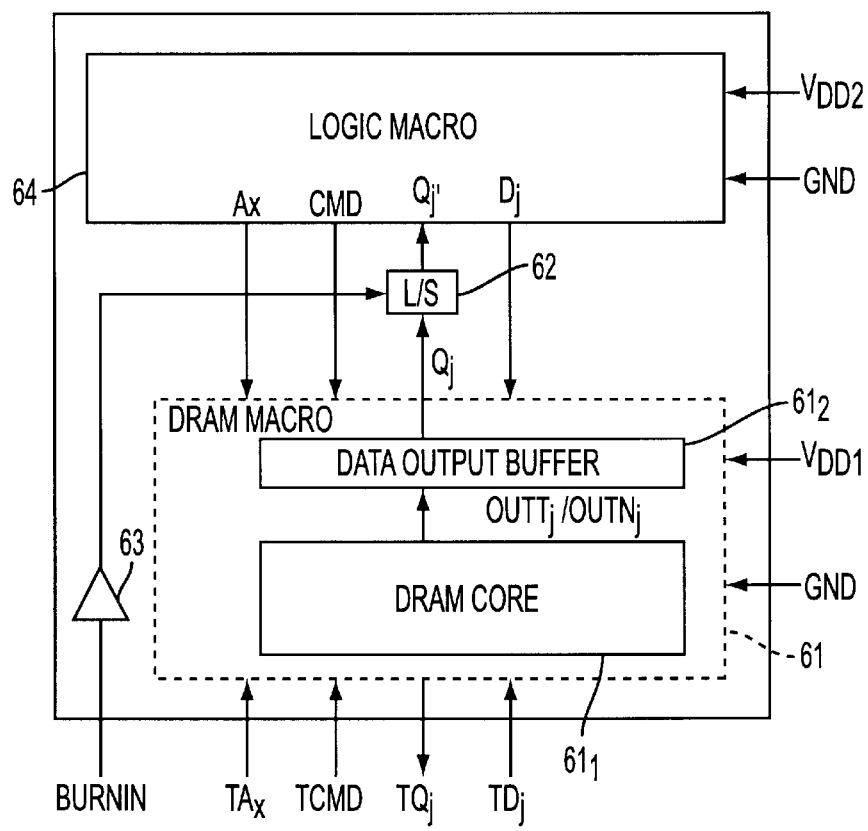
FIG. 10 is a view showing a configuration of a semiconductor integrated circuit in a seventh embodiment of the present invention.

FIG. 10 shows the configuration of a semiconductor integrated circuit according to a seventh embodiment of the present invention. The semiconductor integrated circuit has a DRAM macro 61, a level shifter 62, an input buffer 63 and a logic macro 64.

A power supply voltage $V_{DD1}$ is sent to the DRAM macro 61. The power supply voltage $V_{DD1}$ is 2.5 V at the time of the normal operation. It is 4.5 V higher than that of the normal operation when the burn-in is performed on the semiconductor integrated circuit.

An address signal Ax, a command signal CMD and an input data $D_j$ are inputted to the DRAM macro 61. The DRAM macro 61 fetches the input data $D_j$ in response to the address signal Ax and the command signal CMD.

Moreover, in response to the address signal Ax and the command signal CMD, the DRAM macro 61 outputs the data stored by it, as an output data signal $Q_j$ to the logic macro 62.

The DRAM macro 61 contains a DRAM core $61_1$ and a data output buffer $61_2$. The DRAM core $61_1$ is the portion in the DRAM macro 61 for actually storing a data. The DRAM core $61_1$ outputs the data stored by it, as a complementary output data signal $OUTT_j/OUTN_j$, which is inputted to the data output buffer $61_2$. The data output buffer $61_2$ outputs a data equal to that of the complementary output data signal $OUTT_j/OUTN_j$ as the output data signal $Q_j$.

An amplitude of the output data signal $Q_j$ is equal to the power supply voltage $V_{DD1}$ sent to the DRAM macro 61. That is, the amplitude of the output data signal $Q_j$ is 2.5 V in the normal operation. If the burn-in is performed on the semiconductor integrated circuit, it is 4.5 V higher than that of the normal operation. The output data signal $Q_j$ is outputted to the level shifter 62.

A burn-in indication signal BURNIN is inputted through the input buffer 63 to the level shifter 62.

The burn-in indication signal BURNIN indicates to the level shifter 62 whether or not the burn-in is performed on the semiconductor integrated circuit. The burn-in indication signal BURNIN, if it is at the high level (power supply voltage), indicates that the burn-in is performed on the semiconductor integrated circuit. The burn-in indication signal BURNIN, if it is at the low level (ground level), indicates that the burn-in is not performed on the semiconductor integrated circuit.

The level shifter 62 refers to the burn-in indication signal BURNIN, and carries out a different operation, depending on whether or not the burn-in is performed on the semiconductor integrated circuit. Depending on whether or not the burn-in is performed on the semiconductor integrated circuit, the level shifter 62 generates an input data signal $Q_j'$ substantially equal to the output data signal $Q_j$, or generates an input data signal $Q_j'$ by reducing the amplitude of the output data signal $Q_j$.

If the semiconductor integrated circuit carries out the normal operation, the level shifter 62 outputs the input data signal $Q_j'$ substantially equal to the output data signal $Q_j$ to the logic macro 64. At this time, the amplitudes of the output data signal $Q_j$ and the input data signal $Q_j'$ are both 2.5 V equal to the power supply voltage $V_{DD1}$ sent to the DRAM macro 61.

On the other hand, if the burn-in is performed on the semiconductor integrated circuit, the level shifter 62 reduces the amplitude of the output data signal $Q_j$, generates the input data signal $Q_j'$, and outputs to the logic macro 64. At this time, the amplitude of the output data signal $Q_j$ is 4.5 V equal to the power supply voltage $V_{DD1}$. The amplitude of the input data signal $Q_j'$ is 3.5 V substantially equal to the power supply voltage $V_{DD2}$ sent to the logic macro 64, if the burn-in is performed on the semiconductor integrated circuit.

The thus-generated input data signal $Q_j'$ is outputted to the logic macro 64.

A power supply voltage $V_{DD2}$ is sent to the logic macro 64. The power supply voltage $V_{DD2}$ is 2.5 V when the semiconductor integrated circuit carries out the normal operation. If the burn-in is performed on the semiconductor integrated circuit, it is 3.5 V higher than that of the normal operation. The maximum rated voltage of the logic macro 64 is 4.0 V, which is lower than 4.5 V of the power supply voltage $V_{DD1}$ sent to the DRAM macro 61 if the burn-in is performed on the semiconductor integrated circuit.

The logic macro 64 generates the address signal Ax, the command signal CMD and the input data signal $D_j$, and controls the operation of the DRAM macro 61. Moreover, the logic macro 64 carries out a predetermined logical process, in response to the input data signal $Q_j$.

The operation when the semiconductor integrated circuit in the seventh embodiment carries out the normal operation and the operation when the burn-in is performed are described in succession.

When the semiconductor integrated circuit carries out the normal operation, the power supply voltage $V_{DD1}$ sent to the DRAM macro 61 and the power supply voltage $V_{DD2}$ sent to the logic macro 64 are both set to 2.5 V.

Moreover, the burn-in indication signal BURNIN is set at the low level. The level shifter 62 recognizes that the semiconductor integrated circuit carries out the normal operation, from the burn-in indication signal BURNIN.

The DRAM macro 61 outputs the data stored in the DRAM core $61_1$ as the output data signal $Q_j$. The level shifter 62 outputs the output data signal $Q_j$ in its original state as the input data signal $Q_j'$. An amplitude of the output data signal $Q_j$ is 2.5 V equal to the power supply voltage $V_{DD1}$ sent to the DRAM macro 61, and it is lower than the maximum rated voltage of the logic macro 64. Thus, the logic macro 64 is never broken.

On the other hand, if the burn-in is performed on the semiconductor integrated circuit, the power supply voltage $V_{DD1}$ sent to the DRAM macro 61 is set to 4.5 V, and the power supply voltage $V_{DD2}$ sent to the logic macro 64 is set to 3.5 V. The power supply voltage $V_{DD1}$ sent to the DRAM macro 61 exceeds the maximum rated voltage of the logic macro 64.

If the burn-in is performed on the semiconductor integrated circuit, the burn-in indication signal BURNIN is set at the high level. The level shifter 62 recognizes that the burn-in is performed on the semiconductor integrated circuit, from the burn-in indication signal BURNIN.

In response to the burn-in indication signal BURNIN, the level shifter 62 reduces the amplitude of the output data signal $Q_j$, and outputs as the input data signal $Q_j'$. At this time, the amplitude of the output data signal $Q_j$ is 4.5 V equal to the power supply voltage $V_{DD1}$. The amplitude of the input data signal $Q_j'$ is 3.5 V equal to the power supply voltage $V_{DD2}$. The input data signal $Q_j'$ is inputted to the logic macro 64. The amplitude of the input data signal $Q_j'$ is 3.5 V, which is lower than 4.0 V of the maximum rated voltage of the logic macro 64. Thus, the logic macro 64 is never broken.

As mentioned above, during the burn-in operation, even if the power supply voltage $V_{DD1}$ exceeding the maximum rated voltage of the logic macro 64 is sent to the DRAM macro 61, the semiconductor element included in the logic macro 64 is never broken.

By the way, in the semiconductor integrated circuit of the seventh embodiment, the DRAM macro 61 and the logic macro 64 can be substituted for the typical two macros, similarly to the semiconductor integrated circuits in the first to sixth embodiments.

The semiconductor integrated circuit according to the present invention contains first macros (1, 11, 21 and 31) for outputting a data signal ($Q_j$) and second macros (2, 12, 22 and 32) for receiving the data signal ($Q_j$) (refer to FIGS. 2, 3, 5 and 7). The first macros (1, 11, 21 and 31) fix the data signal ($Q_j$) at a non-high level state that is not a high level, in response to control signals (BURNIN, PON). The semiconductor integrated circuit can control the data signal ($Q_j$) by using the control signals (BURNIN, PON) so that the second macros (2, 12, 22 and 32) are not broken or the erroneous operations are brought about. Here, the non-high level state implies a high impedance state or a low level. However, it is desirable that the non-high level state is the low level so that the erroneous operation is induced in the second macros (2, 12, 22 and 32) receiving the data signal ($Q_j$).

In the semiconductor integrated circuit, there may be a case that the control signal (BURNIN) indicates that the data signal ($Q_j$) is fixed at the non-high level state, when the burn-in is performed on the semiconductor integrated circuit (refer to FIGS. 2, 7). Thus, when the burn-in is performed on the semiconductor integrated circuit, even if the high power supply voltage is sent to the first macros (1, 11, 21 and 31) to thereby output the data signal ($Q_j$) having a high amplitude, the second macros (2, 32) to which the data signal ($Q_j$) is inputted are never broken.

There may be a case that the semiconductor integrated circuit further includes first POR circuits ($11_3$, $31_3$) for monitoring a first power supply voltage ($V_{DD1}$) sent to the first macros (1, 31) and generating the control signal (PON)

in response to the first power supply voltage ($V_{DD1}$) (refer to FIGS. 3, 7). At this time, the first POR circuits ($11_3$, $31_3$) generate the control signal (PON) so as to indicate that the data signal ($Q_j$) is fixed at the non-high level state, if the first power supply voltage ($V_{DD1}$) is lower than a predetermined first standard voltage ($V_{std1}$). Thus, it is possible to protect the erroneous operation caused by the unstable operations of the first macros (1, 31), immediately after the power supply to the semiconductor integrated circuit is turned on.

At this time, there may be a case that the first power supply voltage ($V_{DD1}$) sent to the first macros (1, 11, 21 and 31) is higher than a second power supply voltage ($V_{DD2}$) sent to the second macros (2, 12, 22 and 32), when the burn-in is performed on the semiconductor integrated circuit (refer to FIGS. 2, 3, 5 and 7).

Also, in the semiconductor integrated circuit, there may be a case that the first power supply voltage ($V_{DD1}$) is sent to the first macros (1, 31) (refer to FIGS. 2, 7). At this time, it is desirable for the control signal (BURNIN) to indicate that the data signal ($Q_j$) is fixed at the non-high level state, if the first power supply voltage ($V_{DD1}$) is higher than the maximum rated voltage of the second macros (2, 32).

There may be a case that the semiconductor integrated circuit according to the present invention further includes a second POR circuit ($21_3$) for monitoring a second power supply voltage ($V_{DD2}$) sent to the second macro (22) and generating the control signal (PON) in response to the second power supply voltage ($V_{DD2}$) (refer to FIG. 5). At this time, the second POR circuit ($21_3$) generates the control signal (PON) so as to indicate that the data signal ($Q_j$) is fixed at the non-high level state, if the second power supply voltage ($V_{DD2}$) is lower than a predetermined second standard voltage ($V_{std2}$). Thus, it is possible to protect the latch-up state that may be brought about by the reception of the data signal ($Q_j$) from the first macro (21) while a proper power supply voltage is not applied to the semiconductor element constituting the second macro (22).

There may be a case that the semiconductor integrated circuit according to the present invention further includes third POR circuits ($21_3$, $31_3$) for monitoring the first power supply voltage ($V_{DD1}$) sent to the first macros (21, 31) and the second power supply voltage ($V_{DD2}$) sent to the second macros (22, 32) and generating the control signal (PON) in response to the first power supply voltage ($V_{DD1}$) and the second power supply voltage ($V_{DD2}$) (refer to FIGS. 5, 7). At this time, the third POR circuits ($21_3$, $31_3$) generate the control signal (PON) so as to indicate that the data signal ($Q_j$) is fixed at the non-high level state, if the first power supply voltage ($V_{DD1}$) is lower than the predetermined first standard voltage ($V_{std1}$) or if the second power supply voltage ($V_{DD2}$) is lower than the predetermined second standard voltage ($V_{std2}$).

A semiconductor integrated circuit according to the present invention includes a first macro (41) having an output buffer ($41_2$) for outputting a data signal ($Q_j$) and a second macro (42) to which the second power supply voltage ($V_{DD2}$) is sent and the data signal ($Q_j$) is inputted (refer to FIG. 8). The second power supply voltage ($V_{DD2}$) is sent to the output buffer ($41_2$). Moreover, the output buffer ($41_2$) outputs the data signal ($Q_j$) while making an amplitude of the data signal ($Q_j$) equal to the second power supply voltage ($V_{DD2}$). It is possible to protect a signal having a voltage amplitude exceeding an allowable range from being inputted from the first macro (41) to the second macro (42). Thus, it is possible to protect the break of the semiconductor element included in the second macro (42).

In the semiconductor integrated circuit, there may be a case that the first power supply voltage ($V_{DD1}$) higher than the second power supply voltage ($V_{DD2}$) is sent to the portions besides the output buffer ($41_2$), in the first macro (41). In the semiconductor integrated circuit, it is possible to protect the break of the semiconductor element included in the second macro (42).

Thus, this is especially effective for such a case.

A semiconductor integrated circuit according to the present invention includes a first macro (51) and a second macro (52) to output a data signal ($Q_j$) (refer to FIG. 9). The second macro (52) has an input buffer ($52_1$) to which the data signal ($Q_j$) is inputted, and a logic circuit ($52_2$) to which an input data signal ($In_j$) outputted by the input buffer ($52_1$) on the basis of the data signal ($Q_j$) is inputted. The input buffer ($52_1$) has a first MOS transistor (not shown), and the logic circuit ($52_2$) has a second MOS transistor (not shown).

At this time, a first gate oxide film (not shown) included in the first MOS transistor is thicker than a second gate oxide film (not shown) included in the second MOS transistor. The break of the input buffer ($52_1$) is protected by thickening the first gate oxide film of the first MOS transistor included in the input buffer ($52_1$) to which the data signal ($Q_j$) is inputted.

In the semiconductor integrated circuit, there may be a case that the first macro (51) has a third MOS transistor (not shown) containing a third gate oxide film (not shown). At this time, it is desirable that the second gate oxide film has a thickness substantially equal to that of the third gate oxide film. Accordingly, the first macro (51) and the input buffer ($52_1$) can be formed by the common process. Hence, it is possible to reduce the number of processes.

A semiconductor integrated circuit according to the present invention includes: a first macro (61) for outputting an output data signal ($Q_j$); a level shifter (62) for adjusting an amplitude of the output data signal ($Q_j$) in response to a control signal (BURNIN) to indicate whether or not the burn-in is performed on the semiconductor integrated circuit, and generating an input data signal ($Q_j'$); and a second macro (64) to which the input data signal ($Q_j'$) is inputted (refer to FIG. 10). In the semiconductor integrated circuit, if the burn-in is performed thereon, the level shifter (62) enables the input data signal ($Q_j'$) having a high amplitude to be inputted to the second macro (64).

At this time, there may be a case that the level shifter (62) generates the input data signal ($Q_j'$) while making an amplitude of the input data signal ($Q_j'$) equal to the second power supply voltage ($V_{DD2}$) sent to the second macro (64), if the burn-in is performed on the semiconductor integrated circuit.

Also, in the semiconductor integrated circuit, there may be a case that the first power supply voltage ($V_{DD1}$) sent to the first macro (61) is higher than the second power supply voltage ($V_{DD2}$) sent to the second macro (64). In the semiconductor integrated circuit, it is possible to protect the break of the semiconductor element included in the second macro (64). Thus, this is especially effective for such a case.

Here, there may be a case that the first macros (1, 11, 21, 31, 41, 51 and 61) are the DRAM macros (refer to FIGS. 2, 3, 5 and 7 to 10).

Moreover, there may be a case that the second macros (2, 12, 22, 32, 42, 52 and 62) are the macros constituted by the logic circuits (refer to FIGS. 2, 3, 5 and 7 to 10).

According to the present invention, when the semiconductor integrated circuit including the two macros whose operational voltages are different from each other are operated, the break of the semiconductor element included in the macro having the lower operational voltage can be protected by outputting the signal from the macro having the higher operational voltage to the macro having the lower operational voltage.

According to the present invention, in the semiconductor integrated circuit including the two macros on which the burn-in is performed while the different power supply voltages are sent, the break of the semiconductor element included in the macro having the lower power supply voltage can be protected by outputting the signal from the macro on which the burn-in is performed while the higher power supply voltage is sent, to the macro on which the burn-in is performed while the lower power supply voltage is sent.

Also, according to the present invention, in the DRAM mixture semiconductor integrated circuit in which the DRAM macro and the logic macro are mixed, the break of the semiconductor element included in the logic macro can be protected by outputting the signal from the DRAM macro on which the burn-in is performed while the higher power supply voltage is sent, to the logic macro on which the burn-in is performed while the lower power supply voltage is sent.

Moreover, according to the present invention, the erroneous operation of the semiconductor integrated circuit can be protected when the power supply to the semiconductor integrated circuit including the two macros is started.

What is claimed is:

1. A semiconductor integrated circuit, comprising:

a first macro outputting a data signal; and a second macro inputting said data signal, and wherein said first macro fixes said data signal at a non-high level state that is not a high level in response to a control signal.

2. The semiconductor integrated circuit according to claim 1, wherein said non-high level state is a low level.

3. The semiconductor integrated circuit according to claim 1, wherein when a burn-in is performed on said semiconductor integrated circuit, said control signal indicates that said data signal is fixed at said non-high level state.

4. A semiconductor integrated circuit, comprising:

a first macro outputting a data signal; and a second macro inputting said data signal, wherein said first macro fixes said data signal at a non-high level state that is not a high level in response to a control signal, such that when a first power supply voltage supplied to said first macro is higher than a maximum rated voltage of said second macro, said control signal indicates that said data signal is fixed at said non-high level state.

5. An operating method of a semiconductor integrated circuit, comprising:

(a) inputting a control signal indicating whether or not a burn-in is performed on a semiconductor integrated circuit; and (b) outputting a data signal, and wherein said (b) includes (c) fixing said data signal at non-high level state that is not a high level in response to said control signal when said burn-in is performed on said semiconductor integrated circuit.

6. An operating method of a semiconductor integrated circuit, comprising:

(d) supplying a first power supply voltage to a first macro; and (e) outputting a data signal from said first macro to a second macro, and wherein said (e) includes (f) fixing said data signal at a non-high level state that is not a high level when said first power supply voltage is higher than a maximum rated voltage of said second macro.

* * * * *